United States Patent
Yun et al.

(10) Patent No.: US 10,468,080 B1
(45) Date of Patent: Nov. 5, 2019

(54) MEMORY DEVICE PERFORMING WRITE LEVELING OPERATION

(71) Applicant: SK hynix Inc., Gyeonggi-do (KR)

(72) Inventors: Dae-Ho Yun, Gyeonggi-do (KR); Woong-Kyu Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/277,525

(22) Filed: Feb. 15, 2019

(30) Foreign Application Priority Data

Jul. 31, 2018 (KR) .................. 10-2018-0089101

(51) Int. Cl.
*G11C 7/22* (2006.01)
*G11C 7/10* (2006.01)
*G06F 13/42* (2006.01)

(52) U.S. Cl.
CPC .......... *G11C 7/225* (2013.01); *G06F 13/4243* (2013.01); *G11C 7/1096* (2013.01); *G11C 7/222* (2013.01)

(58) Field of Classification Search
CPC ....... G11C 7/1096; G11C 7/222; G11C 7/225; G06F 13/4243
See application file for complete search history.

(56) References Cited

U.S. PATENT DOCUMENTS

| | | | | |
|---|---|---|---|---|
| 6,985,401 | B2 * | 1/2006 | Jang ................... | G11C 7/22 365/194 |
| 7,123,520 | B2 * | 10/2006 | Seo ..................... | G11C 7/1051 365/189.05 |
| 7,865,660 | B2 * | 1/2011 | Guo .................... | G06F 13/4239 327/157 |
| 9,490,030 | B2 * | 11/2016 | Kang .................. | G11C 7/1066 |
| 9,600,424 | B2 | 3/2017 | Ko et al. | |

FOREIGN PATENT DOCUMENTS

KR 101585213 1/2016

* cited by examiner

*Primary Examiner* — Harry W Byrne
*Assistant Examiner* — R Lance Reidlinger
(74) *Attorney, Agent, or Firm* — IP & T Group LLP

(57) ABSTRACT

A memory device includes a first strobe delay circuit delaying a first data strobe signal to generate a delayed first data strobe signal, a first write leveling circuit sampling a first delay clock in synchronization with the delayed first data strobe signal, a second strobe delay circuit delaying a second data strobe signal to generate a delayed second data strobe signal, a replica second strobe delay circuit delaying the first data strobe signal by a delay value obtained by replicating the second strobe delay circuit to generate a replica delayed second data strobe signal; and a second write leveling circuit sampling a second delay clock in synchronization with the delayed second data strobe signal in a first I/O mode, and sampling the second delay clock in synchronization with the replica delayed second data strobe signal in a second I/O mode.

9 Claims, 2 Drawing Sheets

MEMORY DEVICE PERFORMING WRITE LEVELING OPERATION

CROSS-REFERENCE TO RELATED APPLICATION

This application claims priority under 35 U.S.C. § 119 to Korean Patent Application No. 10-2018-0089101 filed on Jul. 31, 2018, which is incorporated herein by reference in its entirety.

BACKGROUND

1. Field

Exemplary embodiments of the present invention relate to a memory device.

2. Discussion of the Related Art

In a memory device, a clock and a data strobe signal are used. The specification defining the performance of the memory device provides a domain-crossing margin (i.e., tDQSS) between the data strobe signal and the clock. Therefore, the memory device performs a write leveling operation for calibrating a skew between the data strobe signal and the clock which are used for a write operation.

When the write leveling operation is performed, a memory device samples a level of the clock at a rising edge of the data strobe signal, and provides the sampling result to a memory controller. The memory controller adjusts a phase of the data strobe signal using the sampling result provided from the memory device. As a result, the domain-crossing margin tDQSS may be secured.

SUMMARY

Various embodiments of the present invention are directed to a memory device capable of increasing a verification range of a write leveling operation.

In an embodiment of the present invention a memory device may include: a clock buffer suitable for receiving a clock; a first strobe buffer suitable for receiving a first data strobe signal; a first strobe delay circuit suitable for delaying the first data strobe signal to generate a delayed first data strobe signal; a first write leveling circuit suitable for sampling a first delay clock in synchronization with the delayed first data strobe signal, the first delay clock being obtained by delaying the clock by a first delay value; a second strobe buffer for receiving a second data strobe signal; a second strobe delay circuit suitable for delaying the second data strobe signal to generate a delayed second data strobe signal; a replica second strobe delay circuit suitable for delaying the first data strobe signal by a delay value obtained by replicating the second strobe delay circuit to generate a replica delayed second data strobe signal; and a second write leveling circuit suitable for sampling a second delay clock in synchronization with the delayed second data strobe signal in a first I/O mode, and sampling the second delay clock in synchronization with the replica delayed second data strobe signal in a second I/O mode, the second delay clock being obtained by delaying the clock by a second delay value.

In another embodiment of the present invention, a memory device may include: a clock buffer suitable for receiving a clock; a first strobe buffer suitable for receiving a first data strobe signal corresponding to lower data group in first and second I/O modes; a second strobe buffer for receiving a second data strobe signal corresponding to upper data group in the first I/O mode; a strobe delay circuit suitable for delaying the first data strobe signal to generate a delayed first data strobe signal in the first I/O mode; a replica strobe delay circuit suitable for delaying the first data strobe signal by a delay value obtained by replicating the strobe delay circuit to generate a replica delayed second data strobe signal in the second I/O mode; and a write leveling circuit suitable for sampling the clock in synchronization with the delayed first data strobe signal in the first I/O mode, and sampling the clock in synchronization with the replica delayed second data strobe signal in the second I/O mode.

DETAILED DESCRIPTION

Figure 1:
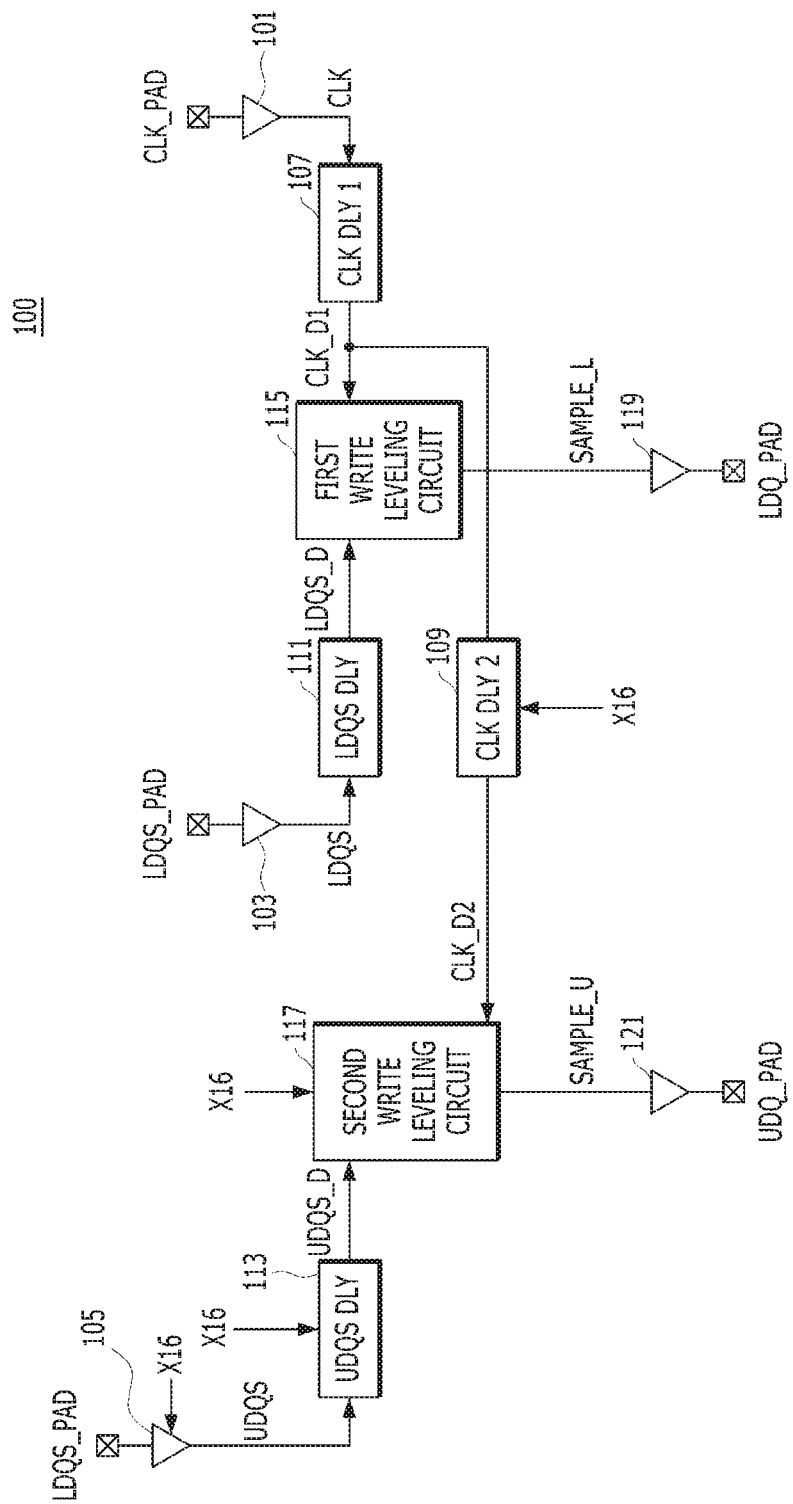
FIG. 1 is a block diagram illustrating a memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Moreover, detailed descriptions related to well-known functions or configurations will be omitted in order to clearly describe the subject matters of the present invention. Throughout the disclosure, like reference numerals refer to like parts throughout the various figures and embodiments of the present invention.

FIG. 1 is a block diagram illustrating a memory device 100.

Referring to FIG. 1, the memory device 100 may include a clock buffer 101, a first strobe buffer 103, a second strobe buffer 105, a first clock delay circuit 107, a second clock delay circuit 109, a first strobe delay circuit 111, a second strobe delay circuit 113, a first write leveling circuit 115, a second write leveling circuit 117, a first output driver circuit 119 and a second output driver circuit 121.

The clock buffer 101 may receive a clock CLK through a clock pad CLK_PAD, the first strobe buffer 103 may receive a first data strobe signal LDQS through a first data strobe pad LDQS_PAD, and the second strobe buffer 105 may receive a second data strobe signal UDQS through a second data strobe pad UDQS_PAD. The first data strobe signal LDQS may indicate a signal for strobing data inputted through zeroth to seventh data pads (not illustrated), and the second data strobe signal UDQS may indicate a signal for strobing data inputted through eighth to fifteenth data pads (not illustrated).

The first clock delay circuit 107 may delay the clock CLK to generate a first delay clock CLK_D1, and the second clock delay circuit 109 may delay the first delay clock CLK_D1 to generate a second delay clock CLK_D2.

The first strobe delay circuit 111 may delay the first data strobe signal LDQS to generate a delayed first data strobe signal LDQS_D, and the second strobe delay circuit 113 may delay the second data strobe signal UDQS to generate a delayed second data strobe signal UDQS_D.

The data inputted through the zeroth to seventh data pads in the memory device 100 may be transferred in synchronization with the first data strobe signal LDQS, and then transferred in synchronization with the clock CLK (i.e., domain-crossed). Furthermore, the data inputted through the eighth to fifteenth data pads in the memory device 100 may be transferred in synchronization with the second data strobe signal UDQS, and then transferred in synchronization with the clock CLK (i.e., domain-crossed). The write leveling operation is performed to adjust the domain-crossing margin tDQSS between the clock CLK and the data strobe signals LDQS and UDQS. Therefore, the delayed first data strobe signal LDQS_D and the first delay clock CLK_D1 need to have timing information on a first point where the data inputted through the zeroth to seventh data pads are domain-crossed from the domain of the first data strobe signal LDQS to the domain of the clock CLK. That is, the first strobe delay circuit 111 may have a delay value obtained by modeling an internal path of the memory device 100, through which the first data strobe signal LDQS is transferred to the first point, and the first clock delay circuit 107 may have a delay value obtained by modeling an internal path of the memory device 100, through which the clock CLK is transferred to the first point. Also, the delayed second data strobe signal UDQS_D and the second delay clock CLK_D2 need to have timing information on a second point where the data inputted to the eighth to fifteenth data pads are domain-crossed from the domain of the second data strobe signal to the domain of the clock. That is, the second strobe delay circuit 113 may have a delay value obtained by modeling an internal path of the memory device 100, through which the second data strobe signal UDQS is transferred to the second point, and the second clock delay circuit 109 may have a delay value obtained by subtracting the delay value of the first clock delay circuit 107 from a delay value obtained by modeling an internal path of the memory device 100, through which the clock CLK is transferred to the second point.

The first write leveling circuit 115 may sample the first delay clock CLK_D1 in synchronization with the delayed first data strobe signal LDQS_D. Specifically, the first write leveling circuit 115 may sample the first delay clock CLK_D1 at a rising edge of the delayed first data strobe signal LDQS_D. The first output driver circuit 119 may transfer the sampling result SAMPLE_L of the first write leveling circuit 115 to a memory controller (not illustrated). The pad LDQ_PAD through which the first output driver circuit 119 outputs the sampling result SAMPLE_L may be one of the zeroth to seventh data pads.

The second write leveling circuit 117 may sample the second delay clock CLK_D1 in synchronization with the delayed second data strobe signal UDQS_D. Specifically, the second write leveling circuit 117 may sample the second delay clock CLK_D2 at a rising edge of the delayed second data strobe signal UDQS_D. The second output driver circuit 121 may transfer the sampling result SAMPLE_U of the second write leveling circuit 117 to the memory controller. The pad UDQ_PAD through which the second output driver circuit 121 outputs the sampling result SAMPLE_U may be one of the eighth to fifteenth data pads.

The memory device 100 may operate not only in an X8 mode in which eight data pads (i.e., the zeroth to seventh data pads) are used, but also in an X16 mode in which 16 data pads (i.e., the zeroth to fifteenth data pads) are used. In FIG. 1, 'X16' represents a signal which is activated in the X16 mode and deactivated in the X8 mode, and the components 105, 109, 113, 117 and 121 which are not used in the X8 mode where the X16 signal is deactivated may be disabled in the X8 mode. Although the X8 mode and X16 mode are exemplified herein, the I/O modes (or the I/O bandwidth options) of the present invention are not limited thereto.

In general, the memory device 100 packaged to operate in the X8 mode and the memory device 100 packaged to operate in the X16 mode are different from each other in terms of the package shape. Therefore, when the memory device 100 is packaged to operate in the X8 mode, the pads which are not used in the X8 mode (for example, UDQS_PAD and UDQ_PAD) are not even coupled to the memory controller outside the memory device. Thus, it is fundamentally impossible to perform a write leveling operation related to the second data strobe signal UDQS.

Figure 2:
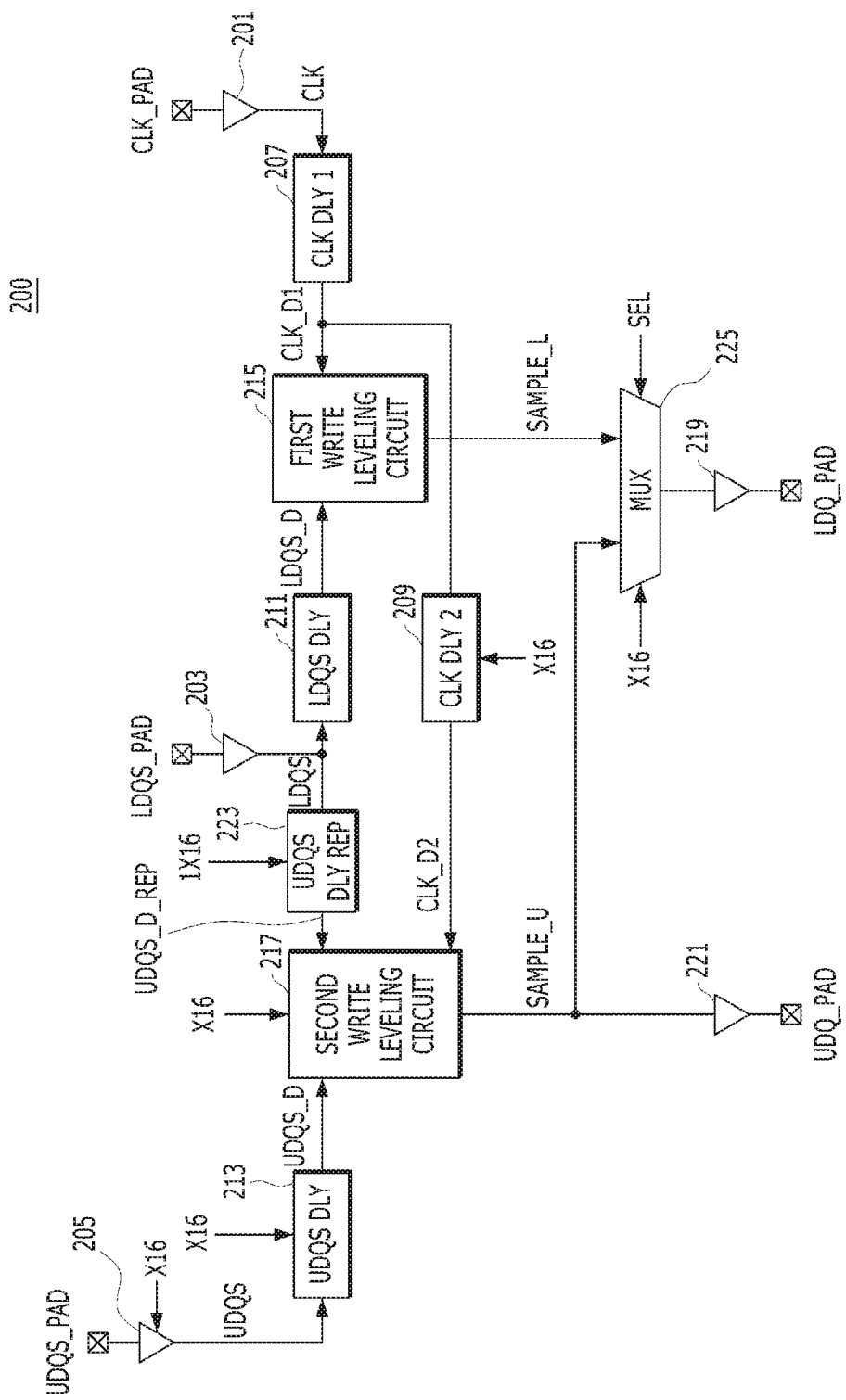
FIG. 2 is a block diagram illustrating a memory device in accordance with an embodiment of the present invention.

FIG. 2 is a block diagram illustrating a memory device 200 in accordance with an embodiment of the present invention.

Referring to FIG. 2, the memory device 200 may include a clock buffer 201, a first strobe buffer 203, a second strobe buffer 205, a first clock delay circuit 207, a second clock delay circuit 209, a first strobe delay circuit 211, a second strobe delay circuit 213, a first write leveling circuit 215, a second write leveling circuit 217, a first output driver circuit 219, a second output driver circuit 221, a replica second strobe delay circuit 223 and a multiplexer 225.

The clock buffer 201 may receive a clock CLK through a clock pad CLK_PAD, the first strobe buffer 203 may receive a first data strobe signal LDQS through a first data strobe pad LDQS_PAD, and the second strobe buffer 205 may receive a second data strobe signal UDQS through a second data strobe pad UDQS_PAD. The second strobe buffer 205 may be disabled in the X8 mode. The first data strobe signal LDQS may indicate a signal for strobing data inputted through zeroth to seventh data pads (not illustrated), and the second data strobe signal UDQS may indicate a signal for strobing data inputted through eighth to fifteenth data pads (not illustrated).

The first clock delay circuit 207 may delay the clock CLK to generate a first delay clock CLK_D1, and the second clock delay circuit 209 may delay the first delay clock CLK_D1 to generate a second delay clock CLK_D2.

The first strobe delay circuit 211 may delay the first data strobe signal LDQS to generate a delayed first data strobe signal LDQS_D, and the second strobe delay circuit 213 may delay the second data strobe signal UDQS to generate a delayed second data strobe signal UDQS_D. The second strobe delay circuit 213 may be enabled in the X16 mode, and disabled in the X8 mode.

The replica second strobe delay circuit 223 may delay the first data strobe signal LDQS by a delay value obtained by replicating the second strobe delay circuit 213 to generate a replica delayed second data strobe signal UDQS_D_REP. The replica delayed second data strobe signal UDQS_D_REP may be obtained by replicating the delayed second data strobe signal UDQS_D. The replica second strobe delay circuit 223 may be disabled in the X16 mode. '/X16' represents an inverted signal of 'X16' signal.

The data inputted through the zeroth to seventh data pads in the memory device 200 may be transferred in synchronization with the first data strobe signal LDQS, and then transferred in synchronization with the dock CLK (i.e., domain-crossed). Furthermore, the data inputted through the eighth to fifteenth data pads in the memory device 200 may be transferred in synchronization with the second data strobe signal UDQS, and then transferred in synchronization with the clock CLK (i.e., domain-crossed). The write leveling operation is performed to adjust the domain-crossing margin tDQSS between the dock CLK and the data strobe signals LDQS and UDQS. Therefore, the delayed first data strobe signal LDQS_D and the first delay clock CLK_D1 need to have timing information on a first point where the data inputted through the zeroth to seventh data pads are domain-crossed from the domain of the first data strobe signal LDQS to the domain of the clock CLK. That is, the first strobe delay circuit 211 may have a delay value obtained by modeling an internal path of the memory device 200, through which the first data strobe signal LDQS is transferred to the first point, and the first clock delay circuit 207 may have a delay value obtained by modeling an internal path of the memory device 200, through which the clock CLK is transferred to the first point. Furthermore, the delayed second data strobe signal UDQS_D and the second delay clock CLK_D2 need to have timing information on a second point where the data inputted through the eighth to fifteenth data pads are domain-crossed from the domain of the second data strobe signal to the domain of the clock. That is, the second strobe delay circuit 213 may have a delay value obtained by modeling an internal path of the memory device 200, through which the second data strobe signal UDQS is transferred to the second point, and the second clock delay circuit 209 may have a delay value obtained by subtracting the delay value of the first clock delay circuit 207 from a delay value obtained by modeling an internal path of the memory device 200, through which the clock CLK is transferred to the second point.

The first write leveling circuit 215 may sample the first delay clock CLK_D1 in synchronization with the delayed first data strobe signal LDQS_D. Specifically, the first write leveling circuit 215 may sample the first delay clock CLK_D1 at a rising edge of the delayed first data strobe signal LDQS_D. The sampling result SAMPLE_L of the first write leveling circuit 215 may be transferred to the multiplexer 225.

The second write leveling circuit 217 may sample the second delay clock CLK_D2 in synchronization with the delayed second data strobe signal UDQS_D in the X16 mode. Specifically, the second write leveling circuit 217 may sample the second delay clock CLK_D2 at a rising edge of the delayed second data strobe signal UDQS_D. The second write leveling circuit 217 may sample the second delay clock in synchronization with the replica delayed second data strobe signal UDQS_D_REP in the X8 mode. The sampling result SAMPLE_U of the second write leveling circuit 217 may be transferred to the second output driver circuit 221 and the multiplexer 225.

The second output driver circuit 221 may be enabled in the X16 mode, and transfer the sampling result SAMPLE_U of the second write leveling circuit 217 to a memory controller (not illustrated) through the pad UDQ_PAD. The pad UDQ_PAD may be one pad of the eighth to fifteenth data pads.

The multiplexer 225 may transfer the sampling result SAMPLE_L of the first write leveling circuit 215 to the first output driver circuit 219 in the X16 mode where the selection signal SEL is activated. In the X8 mode, however, the multiplexer 225 may selectively transfer the sampling result SAMPLE_L of the first write leveling circuit 215 and the sampling result SAMPLE_U of the second write leveling circuit 217 to the first output driver circuit 219 in response to a selection signal SEL. That is, the multiplexer 225 may transfer the sampling result SAMPLE_L to the first output driver circuit 219 when the selection signal SEL is activated in the X8 mode, and transfer the sampling result SAMPLE_U to the first output driver circuit 219 when the selection signal SEL is deactivated in the X8 mode.

The first output driver circuit 219 may transfer the sampling result received from the multiplexer 225 to the memory controller through the pad LDQ_PAD. The pad LDQ_PAD may be one pad of the zeroth to seventh data pads.

Now, the write leveling operations of the memory device 200 in the X16 mode and the X8 mode will be described.

Write Leveling Operation of Memory Device 200 in X16 Mode

In the X16 mode, the replica second strobe delay circuit 223 may be disabled, and the multiplexer 225 may select the sampling result SAMPLE_L of the first write leveling circuit 215.

Thus, in the X16 mode, the first write leveling circuit 215 may sample the first delay clock CLK_D1 in synchronization with the delayed first data strobe signal LDQS_D, and the sampling result SAMPLE_L of the first write leveling circuit 215 may be transferred to the memory controller through the first output driver circuit 219. Furthermore, the second write leveling circuit 217 may sample the second delay clock CLK_D2 in synchronization with the delayed second data strobe signal UDQS_D, and the sampling result SAMPLE_U of the second write leveling circuit 217 may be transferred to the memory controller through the second output driver circuit 221.

Write Leveling Operation of Memory Device 200 in X8 Mode

In the X8 mode, the second strobe buffer 205, the second strobe delay circuit 213 and the second output driver circuit 221 may be disabled. The multiplexer 225 may transfer one of the sampling results SAMPLE_U and SAMPLE_L to the first output driver circuit 219 in response to the selection signal SEL.

In the X8 mode, the first write leveling circuit 215 may sample the first delay clock CLK_D1 in synchronization with the delayed first data strobe signal LDQS_D, and the sampling result SAMPLE_L of the first write leveling circuit 215 may be transferred to the multiplexer 225. Furthermore, the second write leveling circuit 217 may sample the second delay clock CLK_D2 in synchronization with the replica delayed second data strobe signal UDQS_D_REP, and the sampling result SAMPLE_U of the second write leveling circuit 217 may be transferred to the multiplexer 225.

When the selection signal SEL is activated, the multiplexer 225 may select the sampling result SAMPLE_L, and the first output driver circuit 219 may transfer the sampling result SAMPLE_L to the memory controller. In this case, the write leveling operation for securing the domain-crossing margin between the first data strobe signal LDQS and the clock CLK may be performed.

When the selection signal SEL is deactivated, the multiplexer 225 may select the sampling result SAMPLE_U, and the first output driver circuit 219 may transfer the sampling result SAMPLE_U to the memory controller. In this case, an operation similar to the write leveling operation for securing the domain-crossing margin between the second data strobe signal UDQS and the clock CLK may be performed. Since the second data strobe signal UDQS is not present in the X8 mode, the replica delayed second data strobe signal UDQS_D_REP obtained by replicating the delayed second strobe signal UDQS_D may be used instead. However, the write leveling operation for securing the domain-crossing margin between the second data strobe signal UDQS and the clock CLK may be simulated and verified. That is, the verification of the domain-crossing operation between the second data strobe signal UDQS and the clock CLK, which is possible only in the X16 mode, may be performed even in the X8 mode.

In accordance with the embodiment of the present invention, the memory device may increase a verification range of the write leveling operation.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
a clock buffer suitable for receiving a clock;
a first strobe buffer suitable for receiving a first data strobe signal;
a first strobe delay circuit suitable for delaying the first data strobe signal to generate a delayed first data strobe signal;
a first write leveling circuit suitable for sampling a first delay clock in synchronization with the delayed first data strobe signal, the first delay clock being obtained by delaying the clock by a first delay value;
a second strobe buffer for receiving a second data strobe signal;
a second strobe delay circuit suitable for delaying the second data strobe signal to generate a delayed second data strobe signal;
a replica second strobe delay circuit suitable for delaying the first data strobe signal by a delay value obtained by replicating the second strobe delay circuit to generate a replica delayed second data strobe signal; and
a second write leveling circuit suitable for sampling a second delay clock in synchronization with the delayed second data strobe signal in a first I/O mode, and sampling the second delay clock in synchronization with the replica delayed second data strobe signal in a second I/O mode, the second delay clock being obtained by delaying the clock by a second delay value.

2. The memory device of claim 1, further comprising:
a first output driver circuit suitable for outputting the sampling result of the first write leveling circuit in the first I/O mode, and selectively outputting the sampling result of the first write leveling circuit and the sampling result of the second write leveling circuit in the second I/O mode; and
a second output driver circuit suitable for outputting the sampling result of the second write leveling circuit in the first I/O mode.

3. The memory device of claim 2, further comprising:
a first clock delay circuit suitable for generating the first delay clock by delaying the clock by the first delay value; and
a second clock delay circuit suitable for generating the second delay clock by delaying the first delay clock by 'the second delay value–the first delay value'.

4. The memory device of claim 2, further comprising a multiplexer suitable for selectively transferring the sampling result of the first write leveling circuit and the sampling result of the second write leveling circuit to the first output driver circuit in the second I/O mode.

5. The memory device of claim 2, wherein the clock buffer receives the clock through a clock pad,
the first strobe buffer receives the first data strobe signal through a first data strobe pad,
the second strobe buffer receives the second data strobe signal through a second data strobe pad, and
in the second I/O mode, the second data strobe pad is disabled.

6. The memory device of claim 1, wherein the first strobe delay circuit has a delay value obtained by modeling an internal path through which the first data strobe signal is transferred to a first point where first data is domain-crossed from the domain of the first data strobe signal to the domain of the clock, and
the second strobe delay circuit has a delay value obtained by modeling an internal path through which the second data strobe signal is transferred to a second point where second data is domain-crossed from the domain of the second data strobe signal to the domain of the clock,
wherein the first delay value comprises a delay value of an internal path through which the clock is transferred to the first point, and
the second delay value comprises a delay value of an internal path through which the clock is transferred to the second point.

7. The memory device of claim 2, wherein the first write leveling circuit samples the first delay clock at a rising edge of the delayed first data strobe signal, and
the second write leveling circuit samples the second delay clock at a rising edge of the delayed second data strobe signal in the first I/O mode, and samples the second delay clock at a rising edge of the replica delayed second data strobe signal in the second I/O mode.

8. The memory device of claim 2, wherein the first I/O mode comprises an X16 mode, and the second I/O mode comprises an X8 mode.

9. A memory device comprising:
a clock buffer suitable for receiving a clock;
a first strobe buffer suitable for receiving a first data strobe signal corresponding to lower data group in first and second I/O modes;
a second strobe buffer for receiving a second data strobe signal corresponding to upper data group in the first I/O mode;
a strobe delay circuit suitable for delaying the first data strobe signal to generate a delayed first data strobe signal in the first I/O mode;
a replica strobe delay circuit suitable for delaying the first data strobe signal by a delay value obtained by replicating the strobe delay circuit to generate a replica delayed second data strobe signal in the second I/O mode; and
a write leveling circuit suitable for sampling the clock in synchronization with the delayed first data strobe signal in the first I/O mode, and sampling the clock in synchronization with the replica delayed second data strobe signal in the second I/O mode.

* * * * *